United States Patent [19]
Hartney et al.

[11] Patent Number: 5,362,606
[45] Date of Patent: Nov. 8, 1994

[54] POSITIVE RESIST PATTERN FORMATION THROUGH FOCUSED ION BEAM EXPOSURE AND SURFACE BARRIER SILYLATION

[75] Inventors: Mark A. Hartney, Carlisle; John Melngailis, Newton; David C. Shaver, Carlisle, all of Mass.

[73] Assignee: Massachusetts Institute of Technology, Cambridge, Mass.

[21] Appl. No.: 926,971

[22] Filed: Aug. 7, 1992

Related U.S. Application Data

[63] Continuation of Ser. No. 599,033, Oct. 17, 1990, abandoned, which is a continuation-in-part of Ser. No. 423,016, Oct. 18, 1989, Pat. No. 5,139,925.

[51] Int. Cl.$^5$ ............................................. G03F 7/38
[52] U.S. Cl. .................................... 430/315; 430/302; 430/326
[58] Field of Search ............... 430/325, 326, 313, 315, 430/302

[56] References Cited

U.S. PATENT DOCUMENTS 4,613,398  9/1986  Chiong et al. ...................... 430/313
4,810,601  3/1989  Allen et al. ............................ 430/18

FOREIGN PATENT DOCUMENTS 0318956  6/1989  European Pat. Off. .
WO80/02752  12/1980  WIPO .

OTHER PUBLICATIONS

Hiraoka "Positive-Tone Polymer Pattern Fabrication By Gas Phase Surface Modification" IBM Technical Bulletin Sep. 1984, vol. 27, No. 4A, p. 2197.
Schellekens "Super: A Submicron Positive Dry Etch Resisit; a candidate for DUV-lithography" Microelectronic Engineering May 9, 1989, No. 1-4, pp. 561-566.
"Polymers for High Technology—Electronics and Photonics"—ACS Symposium Series 346, American Chemical Society, Washington, D.C. 1987, Murrae J. Bowden and S. Richard Turner, pp. 350-357.

*Primary Examiner*—Charles L. Bowers, Jr.
*Assistant Examiner*—Christopher G. Young
*Attorney, Agent, or Firm*—Thomas J. Engellenner; Michael I. Falkoff

[57] ABSTRACT

A resist exposed to a micron or sub-micron pattern of highly absorbed ion beams forms a highly crosslinked barrier layer in the exposed regions of the resist surface. The complementary surface regions are silylated in a silicon-containing reagent, and the exposed regions are then removed by a plasma etch. Pattern definition is enhanced by limiting the exposure and the silylation to the surface of the resist. The process allows feature definition below 1000 Angstroms using a relatively inexpensive single element low energy ion source.

11 Claims, 4 Drawing Sheets

W - 5 MIN PREBAKE, UNEXPOSED, 100/1/10, REPEAT
X - 5 MIN PREBAKE, 5 MJ, 100/1/10
Y - 5 MIN PREBAKE, 10 MJ, 100/1/10
Z - 5 MIN PREBAKE, 30 MJ, 100/1/10

ZONE SIGNAL VS TIME
ZONE 1

0.5 MICRON FSC 60 MJ

1 μm
22,200 X  20.0 kV 0.4 μm L/S PR W24 50 MJ

1 μm
9,550 X  10.0 kV

POSITIVE RESIST PATTERN FORMATION THROUGH FOCUSED ION BEAM EXPOSURE AND SURFACE BARRIER SILYLATION

The Government has rights in this invention pursuant to contract Number F19628-90-C-0002 awarded by the Department of the Air Force.

This application is a continuation of application Ser. No. 599,033, filed Oct. 17, 1990, now abandoned which is a continuation in part of U.S. Pat. application Ser. No. 423,016, filed Oct. 18, 1989 now U.S. Pat. No. 5,139,925.

TECHNICAL FIELD

The present invention relates to semiconductor patterning and device fabrication, and more particularly to microlithography of the type involving exposure, silylation, and plasma etching, e.g. by oxygen RIE, to selectively remove the non-silylated regions of a resist.

These processes generally start with a single self-planarizing resist layer, which is exposed to a pattern of radiation by direct writing or using an appropriate mask. The exposed layer of resist is then placed in a silylating vapor environment and silicon is incorporated into the resist in either the exposed or the unexposed regions, depending on the process involved.

In one approach, the resist includes, or has additives containing, functional groups which are capable of reacting with the silylating reagent and which are either created or destroyed by illumination, so that silicon which diffuses into the resist is incorporated only into either the illuminated or the unilluminated regions.

In another approach, the resist is formulated with a high concentration of functional groups to which silicon binds, and illumination operates only to control the rate of diffusion of the silylating reagent into the resist. This latter approach has been widely commercialized as the DESIRE process, an acronym for "diffusion enhanced silylating resist".

As a theoretical matter, the rate of diffusion of a particular silylating agent can depend on the composition and degree of crosslinking of the resist, on the presence of certain blocking components in the resist, the presence or creation of porosity in the resist, the mobility and reactivity of the silylating reagent and other factors. For example, one PLASMASK resist employed for the DESIRE processes, utilizes a diazoquinone component to block permeation of the silylating agent, so that only the exposed regions, where diazoquinone is destroyed, absorb and incorporate silicon. The precise mechanism of blocking has been conjectured to rely on thermal crosslinking in the diazoquinone-rich regions, which apparently occurs during the silylating step which is carried out at elevated temperatures. The relatively heavy reagent hexamethyldisilazane (HMDS) is employed as a silylating reagent, and effective differential etch resistance has been attained at various temperatures under differing conditions, and in one process is attained when the silylation is performed in a narrow range of temperatures above 140° C. Thus, the incorporation of silicon may be viewed as a relatively complex end point of a series of possibly competing processes in which light exposure may set certain initial conditions of functionality, porosity and polymer composition, and subsequent heating and silylating drive the processes of diffusion, further crosslinking and chemical attachment or incorporation of silicon.

Various studies have been carried out on commercial novolac resists to elucidate the mechanisms of exposure chemistry. There are some suggestions that the photoactive compound (PAC) added to such resists is the primary factor in effective exposure, and that crosslinking occurs only at rather high temperatures, due in part to reactions with the PAC. For wet processing applications, the exposure chemistry of novolac resists to e-beam and x-ray radiation has also been explored. The varied and sometimes conflicting effects observed in experiments suggest that various factors necessary to the achievement of differential diffusion and the selective incorporation of silicon into regions of the resist are complex and not readily predicted.

Thus, while a general range of possible mechanisms have been discussed, e.g., in U.S. Pat. No. 4,613,398 of Chiong, practical processes appear to have required extensive experimentation and adjustment of many conditions to arrive at one particular set of conditions that result in a sufficient differential rate of silicon incorporation after exposure to achieve a differential etch rate effective to transfer the lithography pattern.

OBJECTS AND SUMMARY OF THE INVENTION

It is an object of the invention to provide an improved resist and method of processing.

It is a further object of the invention to provide a single layer resist and method of selectively silylating and dry-developing the resist to transfer a positive pattern to a substrate.

These and other desirable features are obtained according to the present invention by forming by exposure to a non-damaging fluence of radiation a crosslinked mask at the surface of a thin resist film. The resist is exposed to patterned radiation such that the resist absorbs substantially all radiation in its upper surface, e.g., in a surface depth under a few thousand Angstroms, and crosslinks to a level upon exposure such that the surrounding uncrosslinked regions retain a permeability and functionality for receiving silicon from a silylating agent, while portions of the film at and below the crosslinked regions remain substantially free of silicon. That is, a crosslinked surface mask is formed which prevents the permeation and incorporation of a silylating agent.

The resist is spun as a single layer onto a wafer and is exposed to far ultraviolet or ion beam radiation, to form a pattern of highly crosslinked regions localized at the surface of the film. The exposed wafer is preferably silylated by placing it in an environment of a relatively light and reactive reagent such as a methylated silylamine at relatively low temperatures, resulting in selective incorporation of silicon in at least the surface of the uncrosslinked regions. Development is effected by passing the silylated coated wafer though an oxygen RIE plasma which is controlled to provide a substantially vertical etching profile. Since crosslinking is localized at the surface, the exposed regions of resist etch cleanly. Moreover, with silylation limited to a surface region, neither scattered radiation nor diffusion of silicon occurs at a depth. This allows sharp etch profiles to be achieved by simple control of the etch parameters.

Using 193 nm ultraviolet radiation with exposure energies as low as five to fifty $mJ/cm^2$ for various resist formulations, strict reciprocity was observed, and no photoactive compound was necessary in the resist. Ion beam exposure was also found effective to provide a surface silylation barrier. Steep feature profiles were obtained in patterns having less than one thousand Angstrom feature size formed in half micrometer thick resist films, and relatively low temperature, fast cycle silylation was achieved in processes exhibiting stability characteristic of a single controlling reaction parameter.

BRIEF DESCRIPTION OF THE DRAWINGS

These and other features of the invention will be understood by reference to the following Figures illustrating representative embodiments and results according to the teachings of applicant's invention, taken together with the description thereof, wherein.

DETAILED DESCRIPTION

Figure 1A:
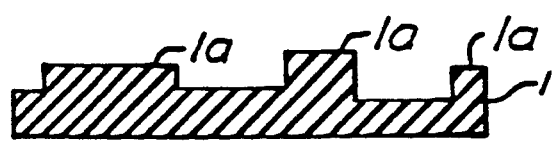
FIGS. 1A–1E illustrate the steps of one microlithography process according to the present invention.
Figure 1B:
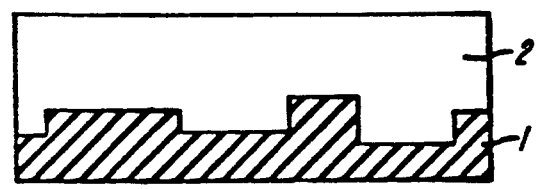
Figure 1C:
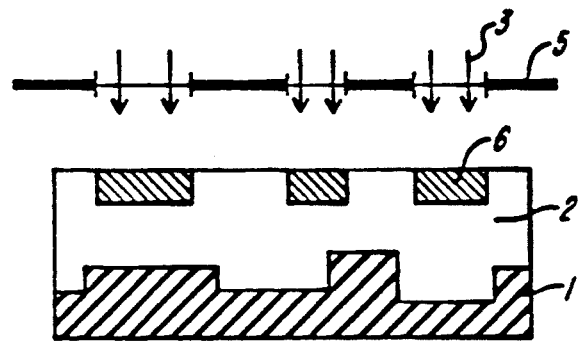
Figure 1D:
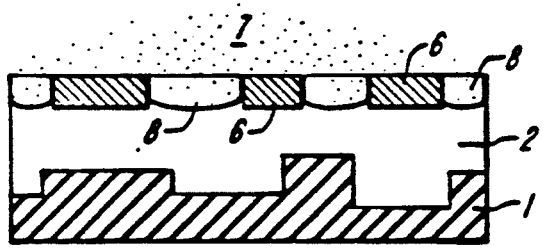
Figure 1E:
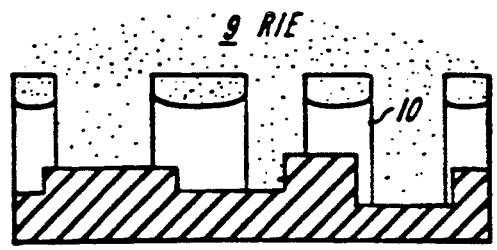

A exemplary process according to applicant's invention is illustrated in FIG. 1, with different stages shown in schematic sections A–E of a wafer or other substrate at different processing steps. As shown at (A), a wafer 1 has surface topography features 1a protruding as a result of earlier material growth, deposition or removal steps. A resist layer 2 is deposited at stage (B), which in the discussion below may be a novolac resist, with or without a photoactive component (PAC), and preferably having a thickness of about 0.5–1.5 microns. Resist layer 2 has sufficient depth to cover the surface topography, but is thin enough to permit the patterning of submicron-scale features. The resist 2 is baked to stabilize the layer and drive off solvent.

At stage (C), the coated wafer 1,2 is exposed to patterned high energy radiation 3, for example, by optical projection through a mask 5, which may, e.g., be defined by an aluminum pattern on a quartz plate. While the Figure shows projection through a mask, the invention also includes exposure by means of focused radiation, such as ion beam or electron beam radiation. According to a principal and preferred aspect of the present invention, the radiation is of a character which is substantially entirely absorbed in the upper surface region of resist layer 2, and is applied in a total dose which crosslinks the exposed surface region 6 to a degree effective to form a silylation mask and prevent subsequent silylation thereof. The fluence is maintained sufficiently low to prevent destructive scission or thermal effects.

At stage (D), the exposed wafer is placed in a silylating environment such that a silylating reagent 7 penetrates and is incorporated into those regions 8 of the resist which were not exposed to radiation, but does not diffuse into or below the crosslinked regions 6. Specifically, reagent 7 penetrates all or partway through film 2 in those areas between the crosslinked regions 6, but the exposed regions 6 serve as a mask substantially inhibiting diffusion of or attachment of silicon. The surface regions between the crosslinked pattern then become silylated, defining a complementary mask for subsequent etching.

At stage (E), the silylated wafer is placed in an oxygen reactive ion etching plasma 9 which etches through the unsilylated crosslinked regions 6 as well as the underlying resist. Strict verticality of the etched walls 10 is achieved by appropriate adjustment of the etch parameters.

Several advantages of exposure and processing according to the present invention can be understood as follows. First, by exposing at a short wavelength which is substantially entirely absorbed at the resist surface, only a small depth of focus is required, and uncontrolled reflection from the wafer surface is eliminated. In the case of exposure by particle beams, such as ions or electrons, backscattering from the substrate and damage to the substrate are avoided by using a low enough particle energy such that the particle dissipates its energy before reaching the substrate. Second, by exposing at relatively low fluences, complicating factors due to thermal effects and scission products are reduced. Third, by employing relatively light or unhindered silylation reagents, lower temperatures and processing times may be used for silylation, further reducing these complicating factors. In particular, silylation is carried out at a temperature at which no significant thermal crosslinking occurs.

Different aspects of the invention and its range of application will be understood from the following examples of resist patterning in accordance with the process of FIG. 1.

The net result of the process is a positive resist pattern with a sharply defined silicon etch barrier, and an exposed region which is, except for a shallow skin, essentially unhardened. The exposed regions are readily etched with a high degree of control by plasma etching.

EXAMPLE 1

A coating of FSC-L was spun onto a substrate to form a film approximately one micron thick, and was subjected to a soft prebake at 90° C. for ninety seconds on a hot plate. Two regimens of exposure to ultraviolet light were carried out, each providing a total dose of 60 mJ/cm$^2$ at 193 nm. In the first case, the dose consisted of twenty-four 2.5 mJ pulses; in the second case the dose was delivered as one hundred twenty 0.5 mJ/cm$^2$ pulses. In each case silylation was then effected by exposing the film to an atmosphere of dimethylsilyl dimethylamine (DMSDMA) at 12 Torr for one minute at 100° C. The silylated substrates were then placed in an oxygen RIE plasma at 20 mTorr and a bias of −200 V for approximately 40 minutes, to clear the unsilylated portions of the resist. Line features of half micron width were formed with sharp profiles in each case.

The resist coating FSC-L is a pure novolac resin, i.e., a cresol-formaldehyde copolymer compounded without a photoactive compound (PAC), manufactured by Shipley for use as a protective surface coating, rather than as a photoresist. A surprisingly high and unexpected crosslinking effect was observed when the coating was illuminated at the 193 nm wavelength of an Argon Fluoride excimer laser, and applicant found this crosslinking to provide an effective silylation barrier for the described process. The novolac cresol-formaldehyde copolymer was highly absorbent at this wavelength, and effects due to scattering and reflection were negligible.

EXAMPLE 2

A coating of MacDermid PR1024 was spun onto a substrate to form a film approximately one micron thick, and was subjected to a prebake as described above. Two regimens of ultraviolet exposure were carried out, each at a fluence of 2.5 mJ/cm$^2$-pulse. Total dosage of 50 and of 40 mJ/cm$^2$ were delivered. The 50 mJ/cm$^2$ exposure was treated with DMSDMA at 90° C. for one minute at 12 Torr. The resist exposed at 40 mJ/cm$^2$ was silylated with DMSDMA at 80° C. for five minutes at a pressure of 10 Torr. Etching was performed as in Example 1. A regular array of 0.4 micron wide lines was formed with clear resolution.

EXAMPLE 3

A resist material (SAL 601 of Shipley) which is compounded for electron beam lithography was coated on a substrate to a depth of approximately one micron. The material was a novolac based resist which contained an organohalide compound as an acid-generating species, and also contained an acid-catalyzed crosslinking agent. After curing, the resist was exposed at a fluence of 2.5 mJ/cm$^2$ per pulse to a total dose of 10 mJ/cm$^2$ of 193 nm radiation. Silylation of the exposed wafer was carried out in trimethylsilyldimethylamine (TMSDMA) for one minute at 140° C. and a pressure 30 Torr. Removal of unsilylated material was achieved in an RIE under approximately the same conditions as in the above two examples. Excellent contrast and submicron feature definition were obtained.

Using the same exposure regimen, the resist was silylated with DMSDMA for one minute at 100° C. and a pressure of 10 Torr. In this case, etching was performed with a two-step process. Prior to an oxygen RIE plasma, the sample was etched for two minutes in a mixture of 80% oxygen, 20% CF$_4$ with a bias of −100 V. The reactive fluorocarbon pre-etch resulted in a clearer final product, with less residue, e.g., grass, in the exposed areas. In this, and certain other experiments, the presence of grass was occasionally noted, particularly in samples which had been stored after silylation and before etching. A dilute hydrofluoric acid liquid post-etch was also found effective to clear up this problem.

EXAMPLE 4

Figure 2:
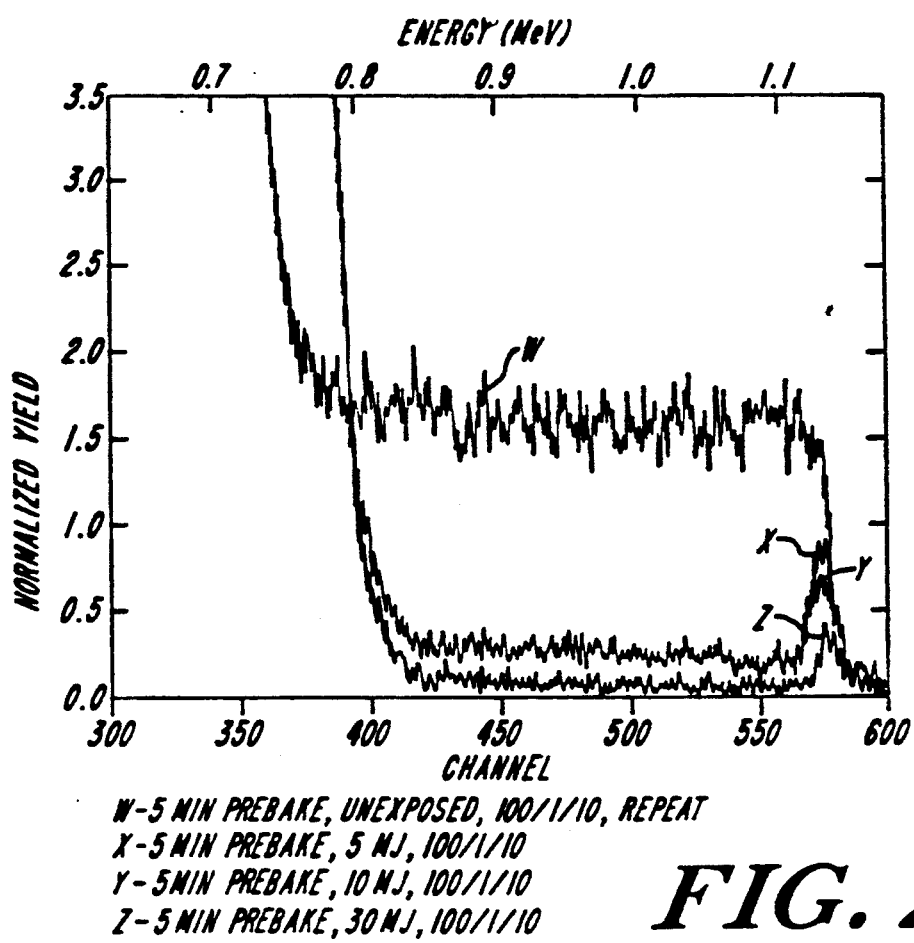
FIG. 2 shows measurements of the silicon depth profile of resists exposed and silylated as in FIG. 1(D)

Using the resist coating of Example 3, a set of four specimens were prepared to assess the degree of crosslinking attained in the exposure step. FIG. 2 shows the Rutherford Backscattering Spectra (RBS) of the four specimens, with exposure doses of 0, 5, 10 and 30 mJ/cm$^2$ shown respectively by the curves labelled W, X, Y and Z. These curves reveal excellent selectivity between exposed and unexposed portions of the resist, and indicate that full saturation is attained at or below the 10 mJ/cm$^2$ exposure level.

EXAMPLE 5

Figure 3A:
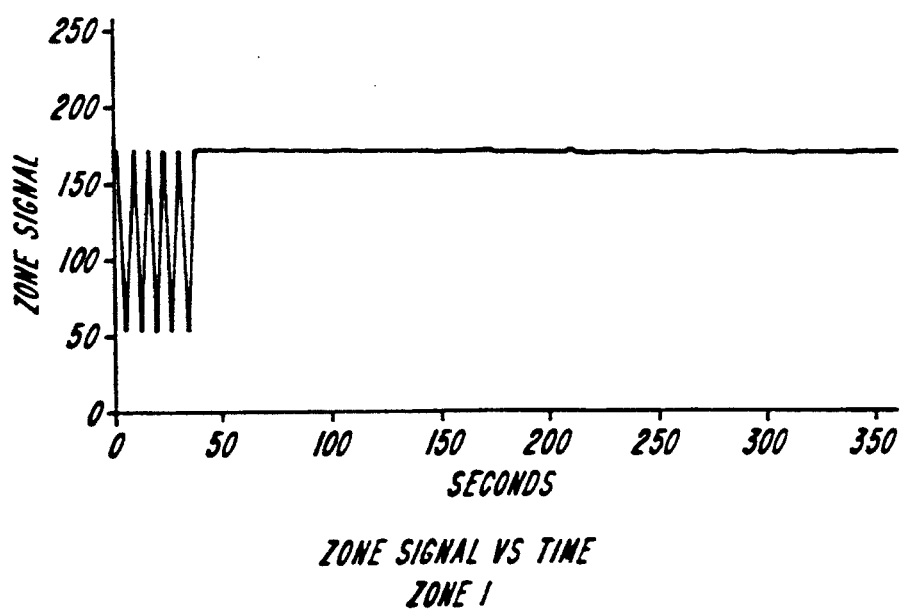
FIGS. 3A, 3B illustrate liquid dissolution rates in treated and untreated regions.
Figure 3B:
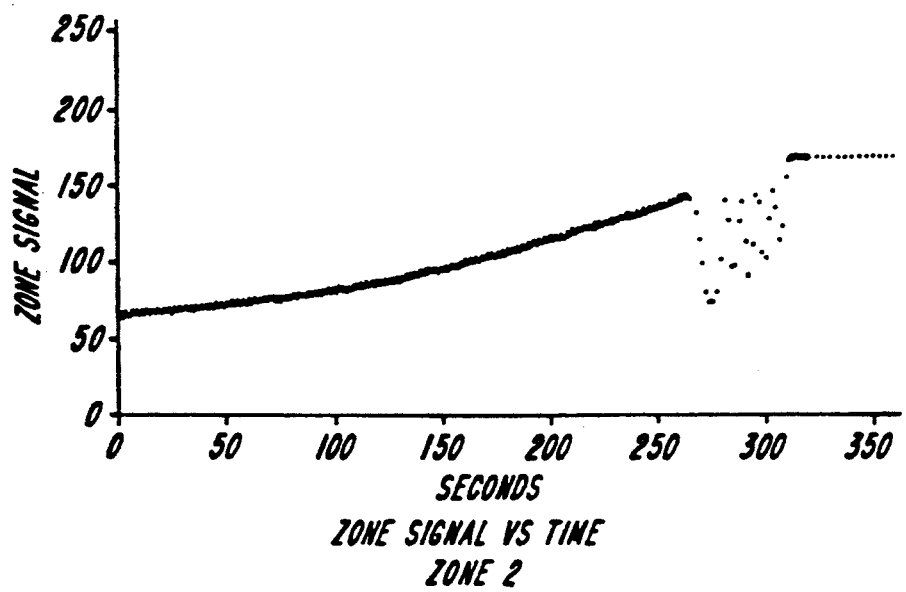

Using the resist coating of Example 2, a pair of specimens were produced and the resist thickness was monitored by an interferometric technique during dissolution to determine the thickness of the exposed layer. FIG. 3A shows the interferogram for an unexposed region of resist. The etch proceeds at an apparently uniform rate, clearing five half wavelengths in under forty seconds, entirely removing the resist. FIG. 3B shows a corresponding curve for a region of the resist exposed at 150 mJ/cm$^2$. Over the course of 250 seconds, the etch reveals no peaks, indicating a negligible material removal rate, totalling under a half wavelength. Thereafter, all material is removed at the same rate as for the unexposed portion shown in the initial portion of the curve of FIG. 3A, clearing the full thickness in approximately forty seconds. This indicates that substantially all crosslinking occurs in a thin region localized at the top of the resist, and that the portion of resist below the top layer is essentially unaffected by exposure. The substantially unlinked condition of the bulk of the resist accounts for the excellent contrast and ease of clearing of the resist below the exposed portions.

EXAMPLE 6

A series of exposures followed by silylation and etching were carried out to determine the efficacy of 193 nm surface crosslinking for pattern formation in different resists. Table 1 sets forth a number of representative process conditions, giving the laser fluence per pulse of the 193 nm Argon Fluoride excimer laser used for exposure, the total dose, the reagent used for silylation and the silylation conditions.

TABLE 1

| Resist | Fluence (mJ/cm$^2$ pulse) | Dose (mJ/cm$^2$) | Si Reagent | Temp (C.) | Time | Pressure (Torr) |
| --- | --- | --- | --- | --- | --- | --- |
| FSC-L | 2.5 | 100 | DMSDMA | 22 | 5 min | 100 |
| 150-g | 2.5 | 100 | HMDS | 140 | 1 min | 70 |
| 150-g | 2.5 | 250 | HMDS | 160 | 2 min | 30 |
| FSC-L | 2.5 | 20 | DMSDMA | 100 | 10 sec | 10 |

Comparing the first and last entries, it is noteworthy that, with the same fluence and silyating reagent, stronger silylating conditions require a greater laser exposure dose to achieve an appropriate level of contrast. In particular, with silylation of 10 seconds at 10 Torr, a relatively low dose of 20 mJ/cm$^2$ was effective, whereas under stronger silylation conditions of 5 minutes at 100 Torr, comparable selectivity was achieved only with the greater 100 mJ/cm$^2$ exposure. The silyation temperature was substantially lowered to achieve suitable stability in the latter process. Similarly, with 150-g, a range of conditions were found suitable, with stronger silylation conditions requiring increased exposure (from 100 to 250 mJ/cm$^2$).

In general, the appropriate exposure levels varied among the resists, with the acid catalyzed special resists requiring the lower exposures, between 5 and 20 mJ/cm$^2$. Typical exposure levels for the FSC materials and the PR1024 were 30 to 75 or more mJ/cm$^2$, and 50 to 150 mJ/cm$^2$ or more, respectively. For Plasmask and for 1400 series resists a 100 mJ/cm$^2$ or greater dose was typical. A significant feature of these exposures was that using the 193 nm radiation to effect crosslinking at the surface, the exposures were found to be highly reciprocal so long as the fluence was maintained substantially below the ablation threshold for the resist.

As regards the silylation conditions, DMSDMA proved the most versatile, with typical times of 1 to 3 minutes at 100° C. This reagent also proved effective at quite low temperatures (25° C.) at longer times. For TMSDMA, a 1 to 3 minute silylation at 140° C. was typical, and for hexamethyldisilazane (HMDS) 5 minutes at 160° C. was typical. As noted above, for milder silylation conditions, lower levels of exposure were found effective.

The generally preferred silylating agents are silylamines, which include the ones listed above, as well as DMSDEA, TMSDEA, TESDEA, bistimethylaminodimethylsilane and others which diffuse readily at temperatures below the thermal crosslinking temperatures.

Once it was discovered that levels of cross-linking which blocked silylation could be achieved by such exposure in a range of resists, including novolac coatings without any photoactive additives, the following general methodology was developed to achieve an effective pattern by silylation and dry etching techniques. First, a given resist was placed in a silylating atmosphere and a range of conditions were tried to determine the optimum parameters necessary to achieve an effective barrier against plasma etching. Next, prior to silylating at those optimum silylating parameters, a series of laser exposures at different doses were made on a set of coated substrates. This series served to determine the minimal exposure which produced a level of crosslinking effective to block silylation in the exposed areas. A suitable set of steps for positive silylation resist patterning was then selected to be an exposure level not substantially above the minimal blocking exposure, followed by silylation at the optimum silylating parameters.

This methodology was found to provide effective exposure regimens for positive silylation resist patterning in a broad range of resists, including resists which had been generally used as negative silylation resists in earlier liquid etch processes. Patterned resists were also exposed using 215 nm ultraviolet light from a Deuterium lamp, with similar results, confirming the suitability of a highly absorbed, very short wavelength exposure source for this method. The resist absorbence at these wavelengths was estimated to be two to ten times greater that the absorbance of resists at the 248 nm wavelength previously employed in some silylation processes. It is expected that metals other than silicon which form effective etch barriers may also be utilized in analogous processes employing suitable organometallic reagents.

Figure 4:
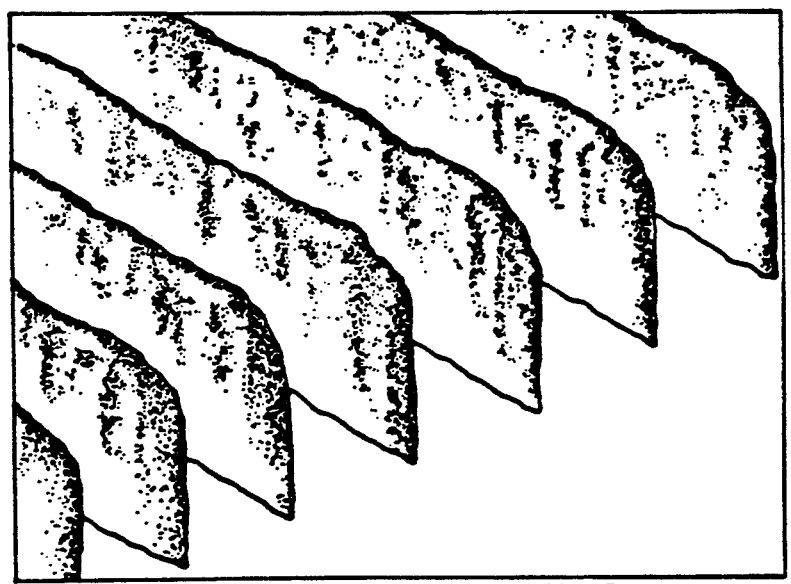
FIGS. 4–6 are photographs of representative etched resist patterns.
Figure 5:
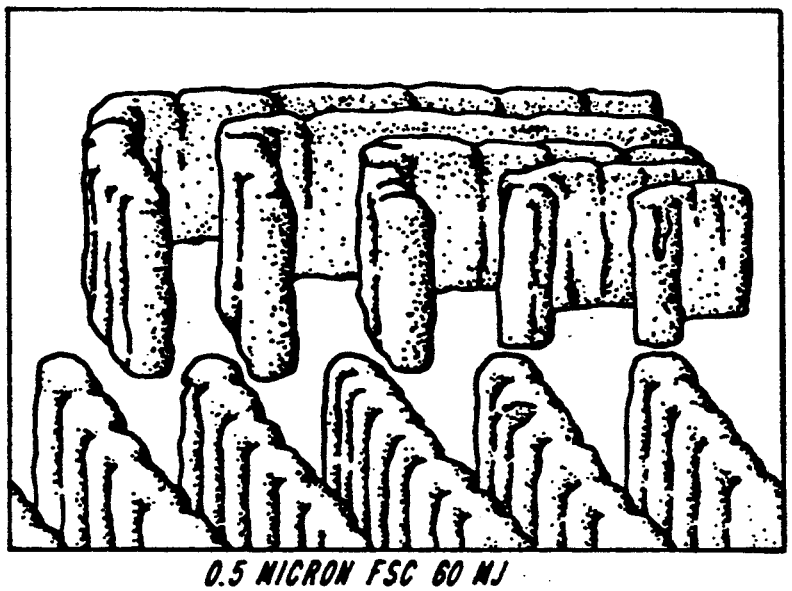
Figure 6:
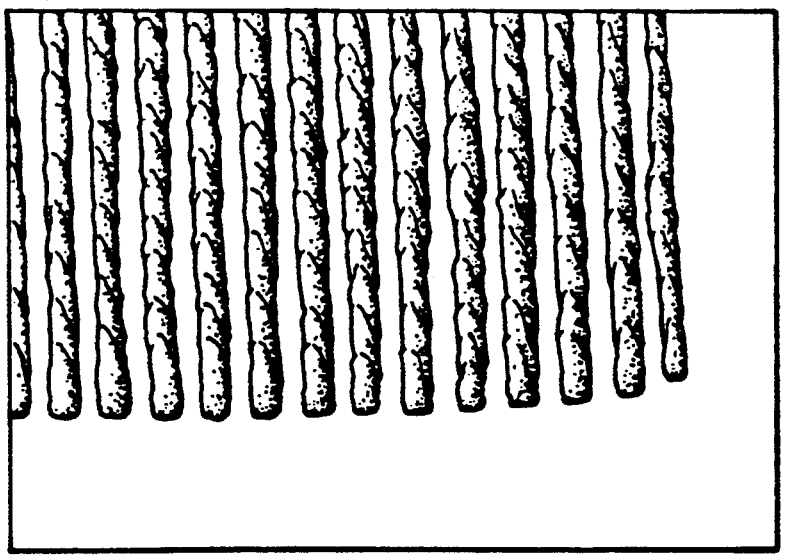

FIGS. 4 through 6 show scanning electron micrographs of resists exposed and etched according to the present invention. FIG. 4 shows a pattern of 0.3 micron features formed as in the first set of conditions described in Example 1. This particular specimen was "prebaked" prior to the actual silylation, for ten minutes on the 100° C. stage in the silylation chamber. Prebake times of two minutes were more commonly used for other samples.

FIG. 5 shows a regular pattern of 0.5 micron lines, spaces and ninety-degree elbows formed in a resist under the second set of exposure conditions described in Example 1 above.

FIG. 6 shows a pattern of 0.4 micron lines and spaces formed in a resist under the first set of conditions described in Example 2 above.

In each case, very clear patterns having steep walls and a high aspect ratio were achieved.

Using a focused ion beam to expose the resists, it was similarly found that a surface crosslinked pattern of high definition could be formed that was an effective high resolution silylation mask. As with the far-UV radiation, such surface crosslinking was effective in pure novolac resists, as well as in resists such as SAL 601 having a photoinitiator for acid catalyzed crosslinking. The following examples demonstrate the range of the technique practiced with ion beam crosslinking.

EXAMPLE 7

A coating of FSC was spun onto a substrate to form a film, and was prebaked as described in Example 1. A focused ion beam of gold ions was then controlled to "write" a test pattern on the film, at an energy of 50 KeV, and the film was then silylated in an atmosphere of DMSDMA at 10 Torr and 100° C. for one minute. The resulting pattern was etched in an oxygen RIE plasma, and produced well defined pattern lines of one-quarter and one micron width, as well as well-defined pattern rectangles of larger dimension. In this case, the total ion dose was $5 \times 10^{12}$ ions/cm$^2$. The steps were repeated using a 280 KeV ion beam, and the identical dose of $5 \times 10^{12}$ ions/cm$^2$.

EXAMPLE 8

Using a SAL 601 resist, the method of Example 7 was repeated with a gold ion beam at energies of 200 KeV and 240 KeV, and a silylation temperature of 80° C. For exposures of $2 \times 10^{12}$ and $4 \times 10^{12}$ ions/cm$^2$, respectively, results comparable to those of Example 7 were obtained, indicating a sensitivity of SAL 601 that is one to three times greater than for the pure novolac resist. Notably, in this resist, exposure with lower-energy ions produced, at a given ion dose, a more effective pattern than the same exposure with higher energy ions.

EXAMPLE 9

Using essentially the same silyation conditions on the exposed wafers, a matrix of focused ion beam exposures of a fixed test array of micron and sub-micron patterns was made for each of the resists of Examples 7 and 8, using beryllium and silicon ion beams at several different energies. In each case, a crisp high definition silylation mask and clean etch were obtained at an ion dose lying between $2 \times 10^{12}$ and $4 \times 10^{13}$ ions/cm$^2$. The optimum exposure dose in each case is set out in Table 2. It is noted that the necessary exposure level for beryllium ions is an order of magnitude greater than the values of FIB reported in the literature to create pattern masks using wet development non-silylation processes. A range of other exposures were also run to determine the suitability of other ion beam processing conditions. For example, a gallium beam of 40 KeV energy requires a dose of $6 \times 10^{12}$ ions/cm$^2$ to produce a complementary silicized mask by silylation with DMSDMA at 10 Torr for one minute at 80° C.

TABLE 2

| | FIB Exposure Level | | | |
|---|---|---|---|---|
| | SAL 601 | | FSC (Novolac) | |
| | 200 Kev | 240 Kev | 50 Kev | 280 Kev |
| Be | $8 \times 10^{12}$ | $2 \times 10^{13}$ | $3 \times 10^{13}$ | $4 \times 10^{13}$ |
| Si | $5 \times 10^{12}$ | $8 \times 10^{12}$ | $2 \times 10^{13}$ | $2 \times 10^{13}$ |
| Au | $2 \times 10^{12}$ | $4 \times 10^{12}$ | $5 \times 10^{12}$ | $5 \times 10^{12}$ |

In the processes shown in TABLE 2, the SAL 601 resist was silylated at 80° C., while the FSC resist was silylated at 100° C.

In general, applicant observed that while the mechanism of ion-beam induced crosslinking may prove inefficient for some processes, or might be expected to introduce problems of wafer damage or contamination, the above described processes provided superior results. By controlling the parameters to crosslink only the top portion of the resist, relatively fast exposures are provided, while the major body of the resist remains unchanged and can be quickly cleared, while wafer damage is entirely avoided. Limiting the cross linking to the surface is achieved by using heavy ions, lower ion beam energies, or both. Thus, gold ions having an energy of about 20 KeV provide effective crosslinking at relatively low doses. These ions do not penetrate beyond the upper portion of the resist, so that no impurities reach the wafer and there is no lattice damage.

Based on the kinetics and empirical observations, it is expected that a 20 KeV gold ion beam will penetrate less than about 0.02 μm into the resist layer. A 100 KeV gallium ion beam will penetrate and crosslink a surface layer under about 0.1 μm thick, while silicon ions at 200 KeV may penetrate up to about 0.25 μm. In each case, crosslinking is limited to the upper half of the resist layer, and preferably to the upper tenth or less, the effective upper constraint being that the surface must be crosslinked to a sufficient depth to block silylation under the selected silylation conditions.

In all of the ion beam exposures, an almost complete absence of proximity effects was noted in the developed resists, as compared, for example, to comparably-sized features defined by electron beam or other submicron lithography. That is, none of the penumbra or secondary electron scattering effects typical of optical or electron beams were noted. Greatest resolution, significantly better than 1000 Angstroms, was obtained with line structures written by a single pass of the ion beam.

While many of the foregoing observations and discoveries were made using a focused ion beam from a multi-element liquid metal source operating at relatively high energy, which required a mass separator and an energy filter in order to provide a finely focused beam, an actual production machine can be significantly simpler than such a research-oriented device. It may have a single element source, with a relatively simple focusing assembly. Such a source is exemplified by the low energy simple focusing machines made by FEI. The use of a low voltage system (e.g., under 25 KeV) using heavy ions (e.g., gallium or heavier metal) without a mass separator significantly reduces the cost of an FIB exposure system.

One important potential application of FIB technology is making masks for x-ray proximity printing. Currently, such masks are made using electron beam lithography, which is subject to resolution limitations caused by electron backscattering of the high energy electrons. Use of focused ion beams in the manner described minimizes this distortion, and may achieve higher ultimate resolution. In preliminary experiments, applicant has achieved resolution of 800 Angstroms, which exceeds the requirements for x-ray mask making. The exposure times for a FIB silylation process are comparable to those used in e-beam lithography, and the cost of a low voltage FIB exposure system as described above would be much lower than an electron beam system capable of comparable resolution.

Silylation processes according to the present invention may also be carried out using very low energy (e.g., under 2 KeV) electron beams, which do not fully penetrate the resist film, at effective exposure levels. Such low energy electrons, especially at the lower end of the energy spectrum down to about 200 eV, can expose and cross-link without generating secondary electrons, thus eliminating a primary cause of proximity effects which have heretofore limited the attainable resolution.

The foregoing examples have been described by reference to films which are formed by spin-coating, but the invention contemplates other methods of applying a resist film. In particular, the film may be dry-deposited on the substrate as a polymer resist film formed from a suitable precursor, such as phenol, in a plasma chamber or the like. In such deposition process, other species may be provided to assure suitable functionalities for enhancing crosslinking upon exposure. Basic plasma-deposited phenol-derived polymers have been found to silylate readily to a sufficient extent for lithography, and the surface techniques may be extended to other resists.

This completes a description of the selective silylation by exposure induced crosslinking processes of the invention, which have been described with respect to illustrative embodiments in a range of materials. The invention being thus described, variations and modifications will occur to those skilled in the art, and such variations and modifications are considered to be within the scope of the invention, as defined as the claims appended hereto.

What is claimed is:

1. A method of forming a positive resist pattern on a substrate, such method comprising the steps of
    forming a film of polymeric resist material having a thickness below approximately two micrometers on the substrate,
    controllably exposing the film to a pattern of focused ion beam radiation at a fluence and at an energy effective to crosslink exposed regions of the film, such that substantially all exposure radiation is absorbed by said resist and crosslinking is localized at the surface of the film without introducing chemical or thermal effects in regions adjacent or below the exposed localized surface regions, forming a crosslinked diffusion barrier layer at the surface such that said exposed surface regions become effectively impermeable to silylating ambients and prevent diffusion therethrough into the film,
    controllably exposing said coated exposed substrate to diffusion of a silylating ambient under controlled conditions of pressure, temperature and time and effective to selectively incorporate silicon into only a surface portion of the unexposed regions of the resist between said exposed regions, in an amount effective to form an etch resistant barrier, and
    etching the film with a plasma etch thereby selectively removing the resist material in said exposed regions.

2. The method of claim 1, wherein the step of exposing is affected by exposing through a mask.

3. The method of claim 1, wherein said radiation is heavy element ion beam radiation.

4. The method of claim 1, wherein said step of forming a film is performed by dry depositing a polymer film on the substrate in a plasma chamber, said polymer film including functionality for crosslinking upon exposure to said ion beam radiation.

5. A method of forming a positive microlithography resist pattern, such method comprising the steps of forming a polymer film on a substrate, said film being a novolac material without photoactive additive, exposing the film to a pattern of focused ion beam radiation that is written by directing the ion beam radiation against the surface of said film to form said resist pattern, said radiation being effective to crosslink only a surface exposed region of the film, said crosslinking occurring within 0.2 microns of said surface, and occurring without introducing thermal or chemical effects into adjacent regions of said film, said crosslinking further forming a diffusion barrier layer that prevents diffusion therethrough of an organometallic reagent, and contacting the coated substrate with the organometallic reageant to incorporate a barrier metal by diffusion into a surface region of the film complementary to said exposed region, and etching said film in a plasma etch, said barrier metal being etch resistant and said plasma etch being effective to remove said exposed region and underlying regions of the film to form said positive microlithography pattern.

6. The method of claim 5, wherein the step of etching includes controlling parameters of the plasma etch to achieve steep side walls.

7. A method of achieving a positive silylation resist film, such method comprising the steps of
   forming a polymeric resist film of a thickness not substantially over one micron thick suitable for patterning to deposit submicron features,
   determining a set of silylation conditions effective to silylate the unexposed resist film just sufficiently to prevent plasma etching,
   exposing the resist film to a pattern of ion beam radiation from a focused ion beam source in a dose such that the resist film undergoes a low temperature self-reaction localized in a surface region thereof and becomes crosslinked in exposed surface regions sufficiently to resist silylation by forming a crosslinked diffusion barrier layer that prevents diffusion of a silylating ambient into the resist film through the barrier layer, and
   silylating the exposed resist film under the determined set of silylation conditions so that insufficient silylation occurs in exposed regions to prevent etching, thereby achieving a positive resist pattern upon plasma etching.

8. The method of claim 7, further comprising the step of etching the exposed silylated resist film in an oxygen RIE plasma etch.

9. The method of claim 8, further comprising the step of providing a halogen-containing pre- or post-etch.

10. A method of achieving a positive silylation resist film, such method comprising the steps of
    forming a polymeric resist film without photoactive compounds and of a thickness under approximately several microns but substantially greater than an absorbance path length of a given ion beam,
    determining a set of low temperature silylation conditions effective to diffuse a silicon-containing reagent into and incorporate silicon in a surface portion of the unexposed resist film to prevent plasma etching,
    exposing the resist film to a pattern of radiation by focusing the given ion beam without a mass separator in a dose such that the resist film becomes crosslinked only in exposed surface regions sufficiently to form a diffusion barrier layer that prevents diffusion of the silicon-containing reagent into or through the barrier layer to resist silylation yet without affecting underlying or adjacent regions of the resist, and
    silylating the exposed resist film under the determined set of silylation conditions, thereby achieving a positive resist pattern upon plasma etching without introducing thermal effects during either the step of exposing or the step of silylating, thereby achieving a pattern of enhanced contrast upon etching away the exposed regions in a plasma etch.

11. A method of achieving a positive silylation resist film, such method comprising the steps of
    forming a polymeric resist film without photoactive compounds and of a thickness under approximately several microns but substantially greater than an absorbance path length of a given ion beam,
    determining a set of low temperature silylation conditions effective to silylate the unexposed resist film to prevent plasma etching,
    exposing the resist film to a focused pattern of radiation from the ion beam source without a mass separator in a dose such that the resist film becomes crosslinked only in exposed surface regions sufficiently to form a diffusion barrier layer that prevents diffusion of a silicon-containing reagent into or through the barrier layer causing it to resist silylation yet without affecting underlying or adjacent regions of the resist, and
    silylating the exposed resist film under the determined set of silylation conditions, thereby achieving a positive resist pattern upon plasma etching without introducing thermal effects during either the step of exposing or the step of silylating, thereby achieving a pattern of enhanced contrast upon etching away the exposed regions in a plasma etch.

* * * * *